United States Patent
Billingsley et al.

(10) Patent No.: US 10,354,989 B1
(45) Date of Patent: Jul. 16, 2019

(54) INTEGRATED ASSEMBLIES AND METHODS OF FORMING INTEGRATED ASSEMBLIES

(71) Applicant: Micron Technology, Inc., Boise, ID (US)

(72) Inventors: Daniel Billingsley, Meridian, ID (US); Everett A. McTeer, Eagle, ID (US); Christopher W. Petz, Boise, ID (US); Haoyu Li, Boise, ID (US); John Mark Meldrim, Boise, ID (US); Yongjun Jeff Hu, Boise, ID (US)

(73) Assignee: Micron Technology, Inc., Boise, ID (US)

(*) Notice: Subject to any disclaimer, the term of this patent is extended or adjusted under 35 U.S.C. 154(b) by 0 days.

(21) Appl. No.: 15/980,908

(22) Filed: May 16, 2018

(51) Int. Cl.
*G11C 11/34* (2006.01)
*H01L 27/02* (2006.01)
*H01L 23/532* (2006.01)
*G11C 5/06* (2006.01)
*H01L 27/12* (2006.01)
*H01L 21/82* (2006.01)

(52) U.S. Cl.
CPC .......... *H01L 27/0203* (2013.01); *G11C 5/06* (2013.01); *G11C 11/34* (2013.01); *H01L 21/82* (2013.01); *H01L 23/5329* (2013.01); *H01L 27/12* (2013.01); *H01L 2924/14* (2013.01)

(58) Field of Classification Search
CPC . H01L 27/0203; H01L 21/82; H01L 23/5329; H01L 27/12; H01L 2924/14; G11C 5/06; G11C 11/34
See application file for complete search history.

(56) References Cited

U.S. PATENT DOCUMENTS

| | | | |
|---|---|---|---|
| 6,548,401 B1 * | 4/2003 | Trivedi | H01L 21/76808 257/E21.579 |
| 6,992,355 B2 * | 1/2006 | Mouli | H01L 29/66772 257/326 |
| 7,915,136 B2 * | 3/2011 | Manning | H01L 28/91 257/E21.396 |
| 2015/0011063 A1 | 1/2015 | Hull et al. | |

* cited by examiner

*Primary Examiner* — Pho M Luu
(74) *Attorney, Agent, or Firm* — Wells St. John P.S.

(57) ABSTRACT

An integrated assembly having an insulative mass with a first region adjacent to a second region. The first region has a greater amount of one or more inert interstitial elements incorporated therein than does the second region. Also, an integrated assembly which has vertically-extending channel material pillars, and which has memory cells along the channel material pillars. A conductive structure is under the channel material pillars. The conductive structure includes doped semiconductor material in direct contact with bottom regions of the channel material pillars. An insulative mass is along the bottom regions of the channel material pillars. The insulative mass has an upper region over a lower region. The lower region has a greater amount of one or more inert interstitial elements incorporated therein than does the upper region. Also, methods of forming integrated assemblies.

32 Claims, 15 Drawing Sheets

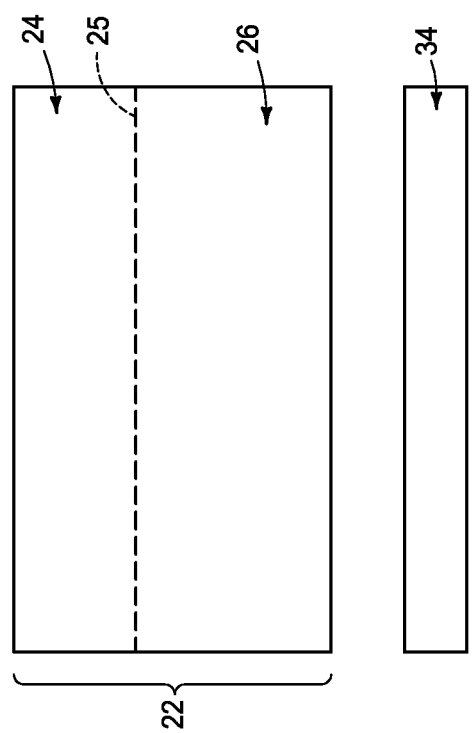

US 10,354,989 B1

INTEGRATED ASSEMBLIES AND METHODS OF FORMING INTEGRATED ASSEMBLIES

TECHNICAL FIELD

Integrated assemblies (e.g., three-dimensional NAND), and methods of forming integrated assemblies.

BACKGROUND

Memory provides data storage for electronic systems. Flash memory is one type of memory, and has numerous uses in modern computers and devices. For instance, modern personal computers may have BIOS stored on a flash memory chip. As another example, it is becoming increasingly common for computers and other devices to utilize flash memory in solid state drives to replace conventional hard drives. As yet another example, flash memory is popular in wireless electronic devices because it enables manufacturers to support new communication protocols as they become standardized, and to provide the ability to remotely upgrade the devices for enhanced features.

NAND may be a basic architecture of flash memory, and may be configured to comprise vertically-stacked memory cells.

Before describing NAND specifically, it may be helpful to more generally describe the relationship of a memory array within an integrated arrangement. FIG. 1 shows a block diagram of a prior art device 1000 which includes a memory array 1002 having a plurality of memory cells 1003 arranged in rows and columns along with access lines 1004 (e.g., wordlines to conduct signals WL0 through WLm) and first data lines 1006 (e.g., bitlines to conduct signals BL0 through BLn). Access lines 1004 and first data lines 1006 may be used to transfer information to and from the memory cells 1003. A row decoder 1007 and a column decoder 1008 decode address signals A0 through AX on address lines 1009 to determine which ones of the memory cells 1003 are to be accessed. A sense amplifier circuit 1015 operates to determine the values of information read from the memory cells 1003. An I/O circuit 1017 transfers values of information between the memory array 1002 and input/output (I/O) lines 1005. Signals DQ0 through DQN on the I/O lines 1005 can represent values of information read from or to be written into the memory cells 1003. Other devices can communicate with the device 1000 through the I/O lines 1005, the address lines 1009, or the control lines 1020. A memory control unit 1018 is used to control memory operations which are to be performed on the memory cells 1003, and utilizes signals on the control lines 1020. The device 1000 can receive supply voltage signals Vcc and Vss on a first supply line 1030 and a second supply line 1032, respectively. The device 1000 includes a select circuit 1040 and an input/output (I/O) circuit 1017. The select circuit 1040 can respond, via the I/O circuit 1017, to signals CSEL1 through CSELn to select signals on the first data lines 1006 and the second data lines 1013 that can represent the values of information to be read from or to be programmed into the memory cells 1003. The column decoder 1008 can selectively activate the CSEL1 through CSELn signals based on the A0 through AX address signals on the address lines 1009. The select circuit 1040 can select the signals on the first data lines 1006 and the second data lines 1013 to provide communication between the memory array 1002 and the I/O circuit 1017 during read and programming operations.

The memory array 1002 of FIG. 1 may be a NAND memory array, and FIG. 2 shows a block diagram of a three-dimensional NAND memory device 200 which may be utilized for the memory array 1002 of FIG. 1. The device 200 comprises a plurality of strings of charge-storage devices. In a first direction (Z-Z'), each string of charge-storage devices may comprise, for example, thirty-two charge-storage devices stacked over one another with each charge-storage device corresponding to one of, for example, thirty-two tiers (e.g., Tier0-Tier31). The charge-storage devices of a respective string may share a common channel region, such as one formed in a respective pillar of semiconductor material (e.g., polysilicon) about which the string of charge-storage devices is formed. In a second direction (X-X'), each first group of, for example, sixteen first groups of the plurality of strings may comprise, for example, eight strings sharing a plurality (e.g., thirty-two) of access lines (i.e., "global control gate (CG) lines", also known as wordlines, WLs). Each of the access lines may couple the charge-storage devices within a tier. The charge-storage devices coupled by the same access line (and thus corresponding to the same tier) may be logically grouped into, for example, two pages, such as P0/P32, P1/P33, P2/P34 and so on, when each charge-storage device comprises a cell capable of storing two bits of information. In a third direction (Y-Y'), each second group of, for example, eight second groups of the plurality of strings, may comprise sixteen strings coupled by a corresponding one of eight data lines. The size of a memory block may comprise 1,024 pages and total about 16 MB (e.g., 16 WLs×32 tiers×2 bits=1,024 pages/block, block size=1,024 pages×16 KB/page=16 MB). The number of the strings, tiers, access lines, data lines, first groups, second groups and/or pages may be greater or smaller than those shown in FIG. 2.

FIG. 3 shows a cross-sectional view of a memory block 300 of the 3D NAND memory device 200 of FIG. 2 in an X-X' direction, including fifteen strings of charge-storage devices in one of the sixteen first groups of strings described with respect to FIG. 2. The plurality of strings of the memory block 300 may be grouped into a plurality of subsets 310, 320, 330 (e.g., tile columns), such as tile column$_I$, tile column$_j$ and tile column$_K$, with each subset (e.g., tile column) comprising a "partial block" of the memory block 300. A global drain-side select gate (SGD) line 340 may be coupled to the SGDs of the plurality of strings. For example, the global SGD line 340 may be coupled to a plurality (e.g., three) of sub-SGD lines 342, 344, 346 with each sub-SGD line corresponding to a respective subset (e.g., tile column), via a corresponding one of a plurality (e.g., three) of sub-SGD drivers 332, 334, 336. Each of the sub-SGD drivers 332, 334, 336 may concurrently couple or cut off the SGDs of the strings of a corresponding partial block (e.g., tile column) independently of those of other partial blocks. A global source-side select gate (SGS) line 360 may be coupled to the SGSs of the plurality of strings. For example, the global SGS line 360 may be coupled to a plurality of sub-SGS lines 362, 364, 366 with each sub-SGS line corresponding to the respective subset (e.g., tile column), via a corresponding one of a plurality of sub-SGS drivers 322, 324, 326. Each of the sub-SGS drivers 322, 324, 326 may concurrently couple or cut off the SGSs of the strings of a corresponding partial block (e.g., tile column) independently of those of other partial blocks. A global access line (e.g., a global CG line) 350 may couple the charge-storage devices corresponding to the respective tier of each of the plurality of strings. Each global CG line (e.g., the global CG line 350) may be coupled to a plurality of sub-access lines (e.g., sub-CG lines) 352, 354, 356 via a corresponding one of a plurality of sub-string drivers 312, 314 and 316. Each of the sub-string drivers may concurrently couple or cut off the charge-storage devices corresponding to the respective partial block and/or tier independently of those of other partial blocks and/or other tiers. The charge-storage devices corresponding to the respective subset (e.g., partial block) and the respective tier may comprise a "partial tier" (e.g., a single "tile") of charge-storage devices. The strings corresponding to the respective subset (e.g., partial block) may be coupled to a corresponding one of sub-sources 372, 374 and 376 (e.g., "tile source") with each sub-source being coupled to a respective power source.

The NAND memory device 200 is alternatively described with reference to a schematic illustration of FIG. 4.

The memory array 200 includes wordlines $202_1$ to $202_N$, and bitlines $228_1$ to $228_M$.

The memory array 200 also includes NAND strings $206_1$ to $206_M$. Each NAND string includes charge-storage transistors $208_1$ to $208_N$. The charge-storage transistors may use floating gate material (e.g., polysilicon) to store charge, or may use charge-trapping material (such as, for example, silicon nitride, metallic nanodots, etc.) to store charge.

The charge-storage transistors 208 are located at intersections of wordlines 202 and strings 206. The charge-storage transistors 208 represent non-volatile memory cells for storage of data. The charge-storage transistors 208 of each NAND string 206 are connected in series source-to-drain between a source-select device (e.g., source-side select gate, SGS) 210 and a drain-select device (e.g., drain-side select gate, SGD) 212. Each source-select device 210 is located at an intersection of a string 206 and a source-select line 214, while each drain-select device 212 is located at an intersection of a string 206 and a drain-select line 215. The select devices 210 and 212 may be any suitable access devices, and are generically illustrated with boxes in FIG. 1.

A source of each source-select device 210 is connected to a common source line 216. The drain of each source-select device 210 is connected to the source of the first charge-storage transistor 208 of the corresponding NAND string 206. For example, the drain of source-select device $210_1$ is connected to the source of charge-storage transistor $208_1$ of the corresponding NAND string $206_1$. The source-select devices 210 are connected to source-select line 214.

The drain of each drain-select device 212 is connected to a bitline (i.e., digit line) 228 at a drain contact. For example, the drain of drain-select device $212_1$ is connected to the bitline $228_1$. The source of each drain-select device 212 is connected to the drain of the last charge-storage transistor 208 of the corresponding NAND string 206. For example, the source of drain-select device $212_1$ is connected to the drain of charge-storage transistor $208_N$ of the corresponding NAND string $206_1$.

The charge-storage transistors 208 include a source 230, a drain 232, a charge-storage region 234, and a control gate 236. The charge-storage transistors 208 have their control gates 236 coupled to a wordline 202. A column of the charge-storage transistors 208 are those transistors within a NAND string 206 coupled to a given bitline 228. A row of the charge-storage transistors 208 are those transistors commonly coupled to a given wordline 202.

It can be difficult to form vertical pillars of three-dimensional NAND. It would be desirable to develop improved methods of fabricating three-dimensional NAND, and to develop architecture fabricated utilizing such methods. It would also be desirable for the methods to be suitable in other applications, and to lead to architectures which detectably indicate that the methods were utilized.

BRIEF DESCRIPTION OF THE DRAWINGS

FIG. 14 is a diagrammatic cross-sectional side view of an example insulative mass.

DETAILED DESCRIPTION OF THE ILLUSTRATED EMBODIMENTS

Some embodiments include recognition that the density of an insulative material may be lowered by incorporating inert interstitial elements (e.g., argon, xenon, etc.,) into the insulative material. It is also recognized that insulative materials having lower density may etch faster than compositionally-identical insulative materials having higher density. In some embodiments, an insulative mass is formed to have one region of lower density adjacent another region of higher density. The region of lower density etches faster than the difference of higher density under wet etching conditions, and such difference is taken advantage of to improve a configuration of openings formed through the mass as compared to analogous openings formed through conventional insulative materials. In some embodiments, the insulative mass is utilized to improve fabrication of channel material pillars of highly-integrated three-dimensional NAND. Example embodiments are described below with reference to FIGS. 1-14.

Figure 1:
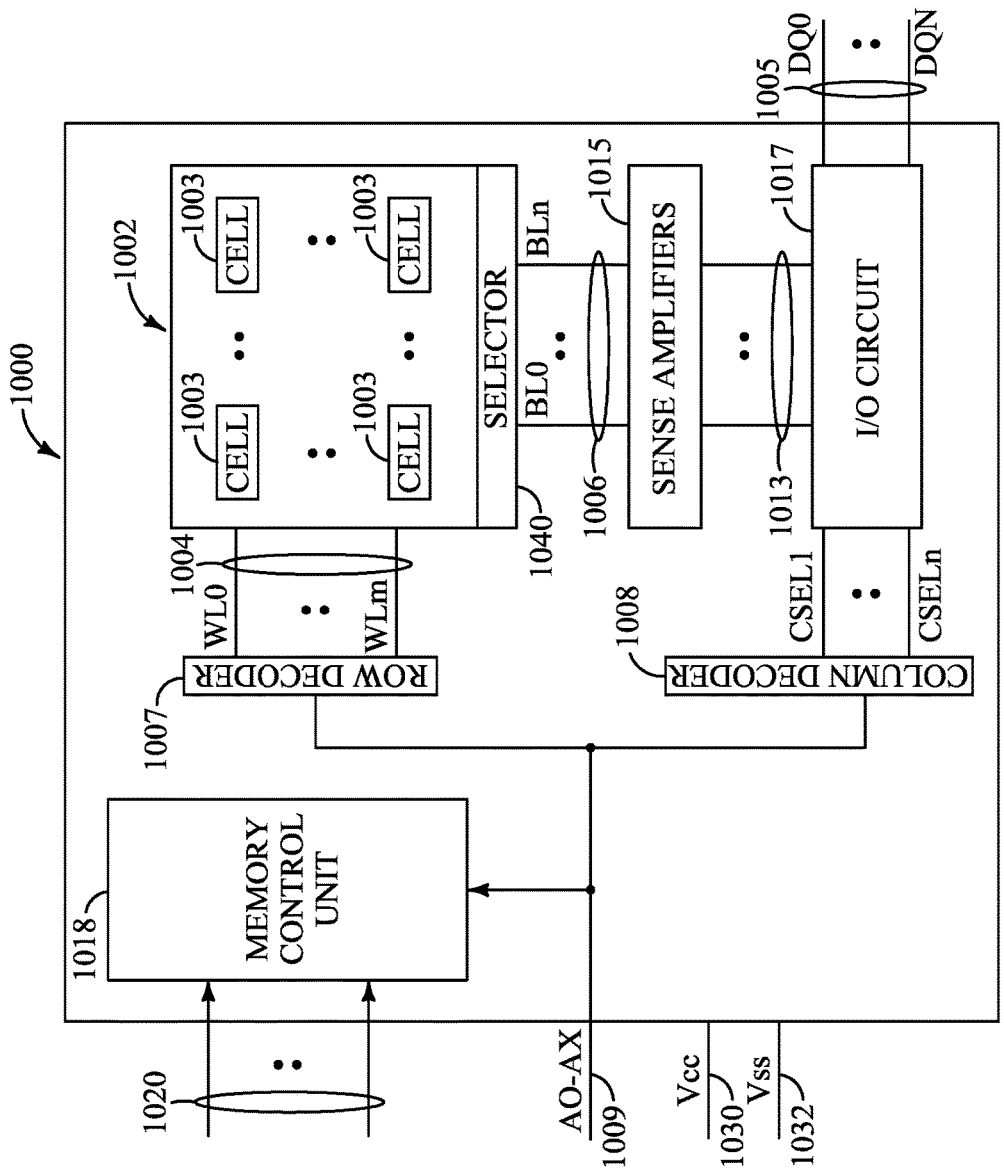
FIG. 1 shows a block diagram of a prior art memory device having a memory array with memory cells.
Figure 2:
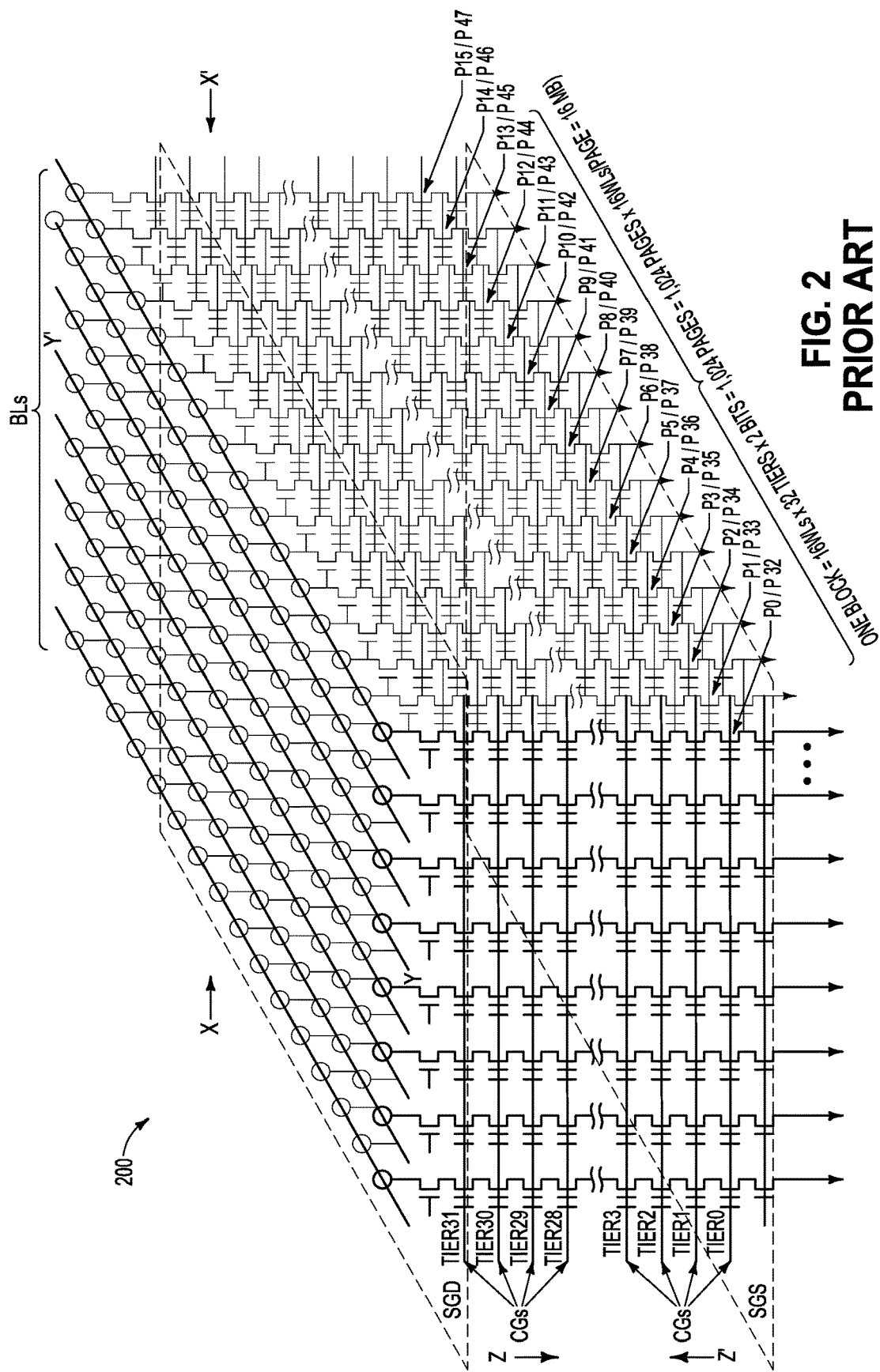
FIG. 2 shows a schematic diagram of the prior art memory array of FIG. 1 in the form of a 3D NAND memory device.
Figure 3:
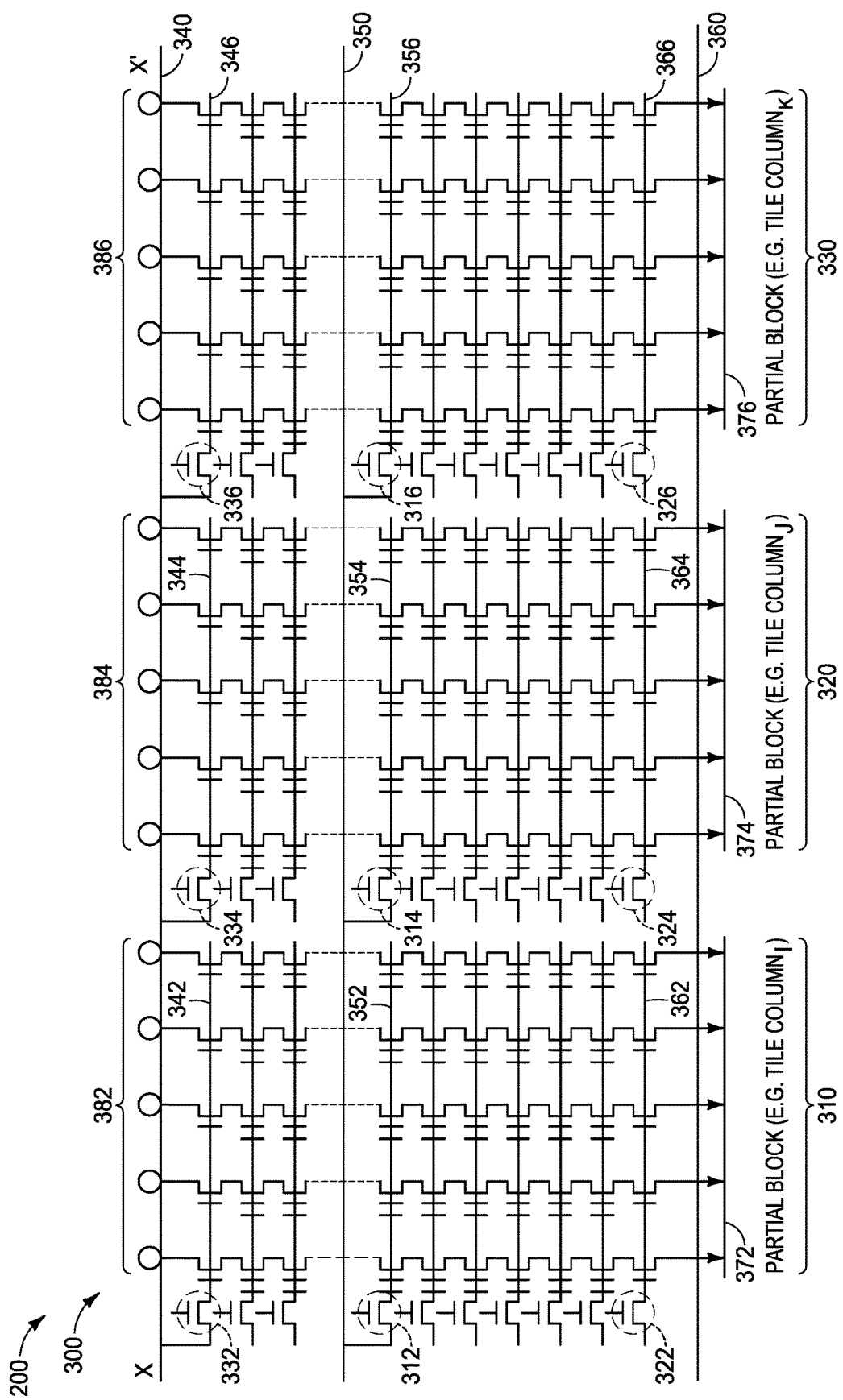
FIG. 3 shows a cross sectional view of the prior art 3D NAND memory device of FIG. 2 in an X-X' direction.
Figure 4:
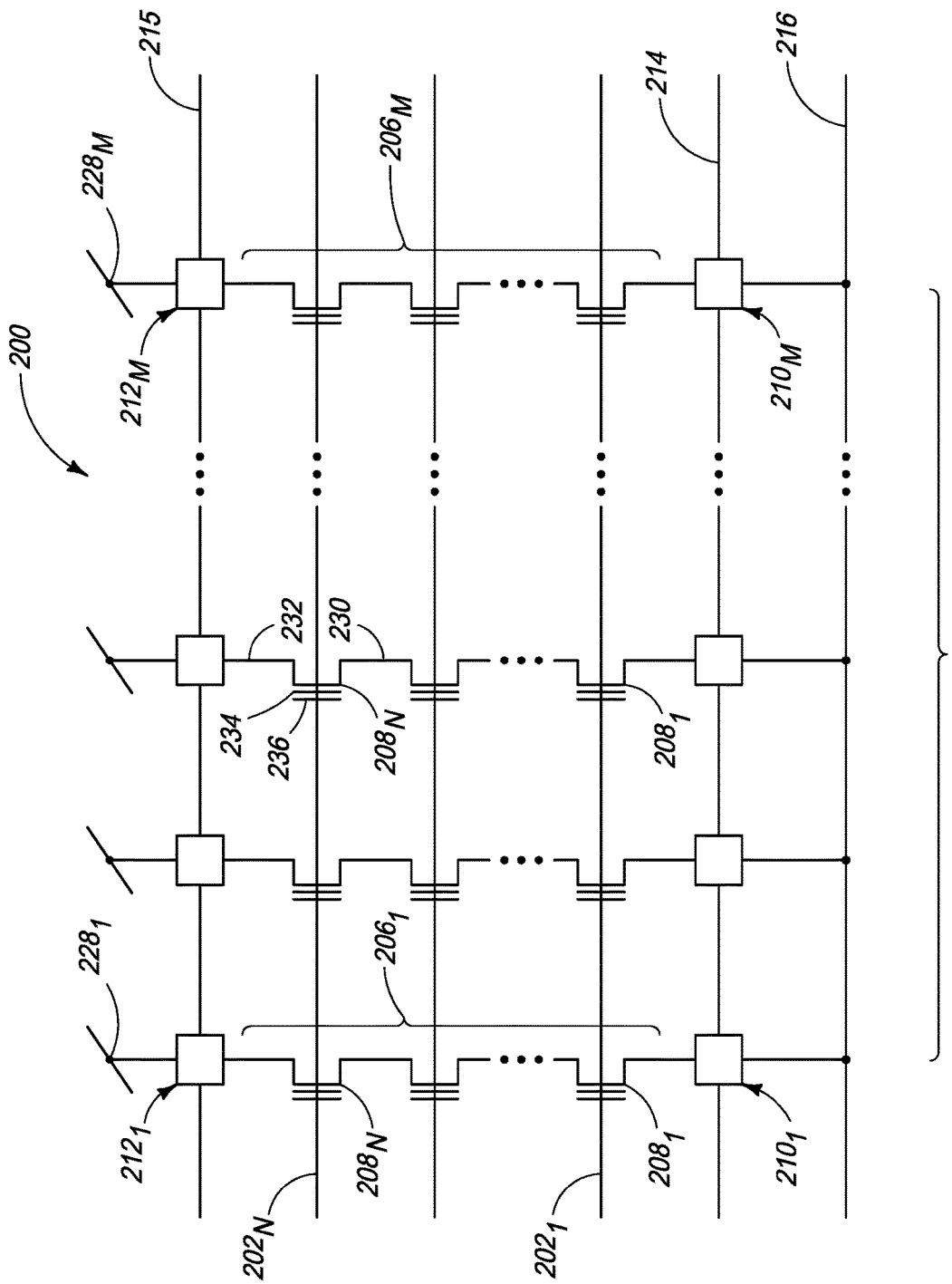
FIG. 4 is a schematic of a prior art NAND memory array.
Figure 5:
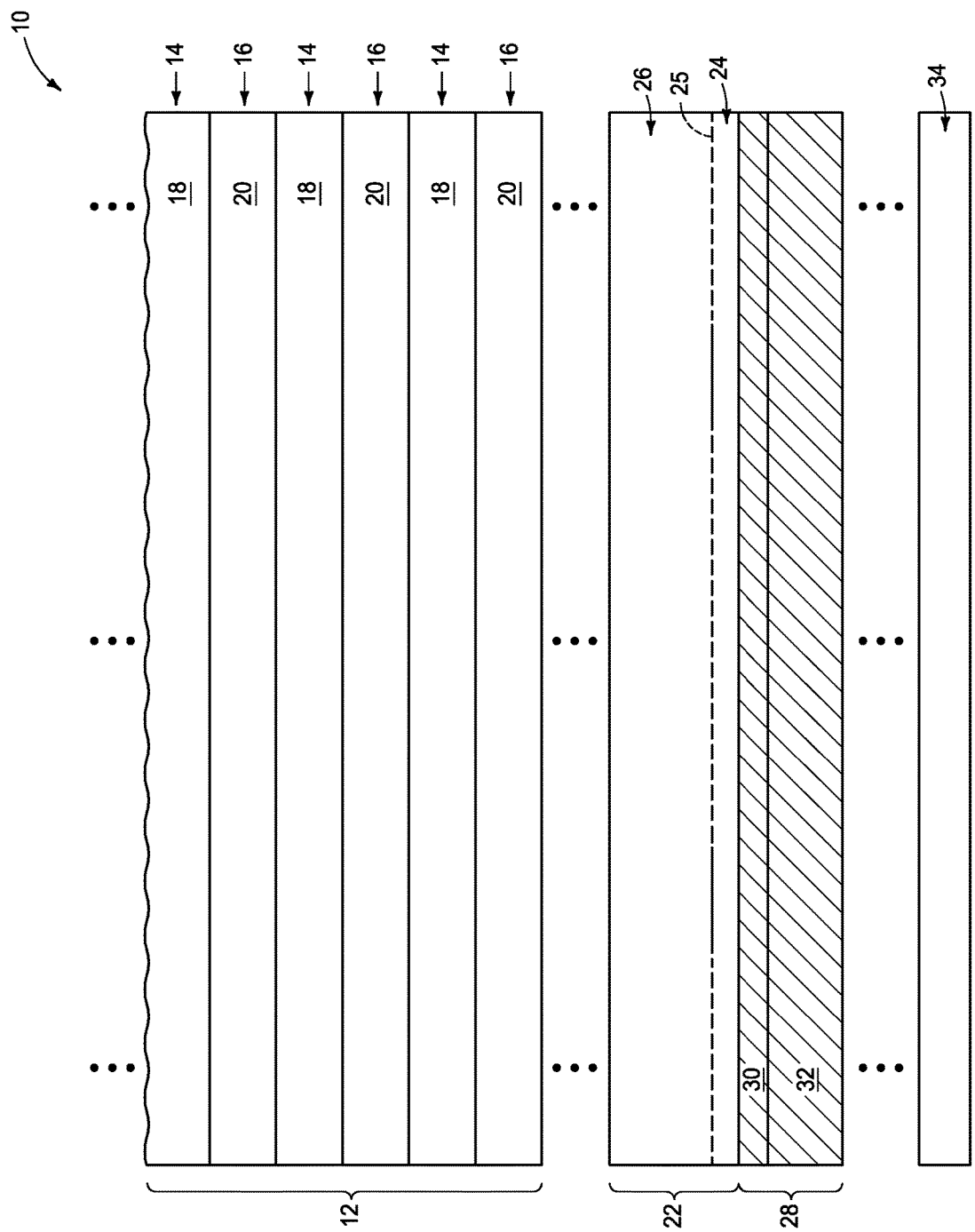
FIGS. 5-10 are diagrammatic cross-sectional side views of regions of an example construction at example process stages of an example method for fabricating an example memory array.

Referring to FIG. 5, a construction (i.e., assembly, architecture, etc.) 10 includes a stack 12 of alternating first and second levels 14 and 16. The first levels 14 comprise first material 18, and the second levels 16 comprise second material 20. The first and second materials 18 and 20 may be any suitable materials. In some embodiments, the first material 18 may comprise, consist essentially of, or consist of silicon nitride; and the second material 20 may comprise, consist essentially of, or consist of silicon dioxide.

The levels 14 and 16 may be of any suitable thicknesses; and may be the same thickness as one another, or different thicknesses relative to one another. In some embodiments, the levels 14 and 16 may have vertical thicknesses within a range of from about 10 nanometers (nm) to about 400 nm.

The material 18 of the first levels 14 is ultimately replaced with conductive material of memory cell gates. Accordingly, the levels 14 may ultimately correspond to memory cell levels of a NAND configuration. The NAND configuration will include strings of memory cells (i.e., NAND strings), with the number of memory cells in the strings being determined by the number of vertically-stacked levels 14.

The NAND strings may comprise any suitable number of memory cell levels. For instance, the NAND strings may have 8 memory cell levels, 16 and memory cell levels, 32 memory cell levels, 64 memory cell levels, 512 memory cell levels, 1024 memory cell levels, etc. The vertical stack 12 is shown to extend outwardly beyond the illustrated region of the stack to indicate that there may be more vertically-stacked levels than those specifically illustrated in the diagram of FIG. 5.

The stack 12 is over an insulative mass 22, which in turn is over a conductive structure 28. A gap is provided between the stack 12 and the insulative mass 22 to indicate that there may be additional materials and/or components provided within the assembly 10 which are not shown. For instance, source-side select gates may be provided within the illustrated gap between the stack 12 and the insulative mass 22. In some embodiments, a source-side select gate may be directly against the insulative mass 22.

The insulative mass 22 is shown comprising two regions 24 and 26, with a dashed line 25 diagrammatically illustrating an approximate boundary between the two regions. In some embodiments, the regions 24 and 26 may be referred to as a first region and a second region, respectively. In some embodiments, the regions 24 and 26 may be referred to as a lower region and an upper region, respectively.

In some embodiments, the insulative mass 22 may be referred to as an etch-stop material in that such material stops the downward progression of an etch utilized to form openings through the stack 12.

In some embodiments, the lower region 24 of insulative mass 22 has a lower density than the upper region 26, and thus is more susceptible to a wet etch. Such may improve a configuration of openings formed through the mass 22, as discussed below with reference to FIGS. 7 and 8. The reduced density of the lower region 24 may be achieved with any suitable methodology. In some embodiments, one or more inert interstitial elements are incorporated into the lower region 24 to reduce the density of such lower region. The inert interstitial elements may be selected from the group consisting of argon, xenon, krypton, helium, neon and mixtures thereof. The upper region 26 may or may not comprise inert interstitial elements; but regardless comprises a lesser amount of the inert interstitial elements per unit volume as compared to the lower region 24. In some embodiments, the upper region 26 comprises an amount of the one or more inert interstitial elements incorporated therein to within a range of from about 0 atomic percent (at %) to less than or equal to about 2 at %; and the lower region 24 comprises an amount of the inert interstitial elements incorporated therein to within a range of from about 1 at % to less than or equal to about 10 at %. In some embodiments, the amount of the inert interstitial elements incorporated within the upper region 26 is within a range of from about 0 at % to about 0.5 at %; and in some embodiments the amount of the inert interstitial elements incorporated within the upper region 26 is about 0 at %. In some embodiments the amount of the one or more interstitial elements incorporated within the lower region 24 is at least about 1 at %; in some embodiments is within a range of from about 1 at % to less than or equal to about 5 at %; and in some embodiments is within a range of from about 1 at % to less than or equal to about 3 at %.

The insulative mass 22 may comprise any suitable insulative composition. In some embodiments, a single insulative composition extends across the upper and lower regions 26 and 24; with the only difference between the upper and lower regions being that there is a higher amount of inert interstitial elements dispersed throughout the lower region (per unit volume) than is dispersed throughout the upper region. In other embodiments, the upper region may comprise a different insulative composition than the lower region. In some embodiments, one or both of the upper and lower regions may comprise two or more different insulative compositions. In such embodiments, the upper region 26 may comprise an entirely different composition than the lower region 24, or may comprise at least one insulative composition in common with the lower region 24.

Example insulative compositions that may be utilized within the insulative mass 22 include one or more of silicon nitride, silicon carbide, and insulative oxides. Example insulative oxides include magnesium oxide, scandium oxide, yttrium oxide, hafnium oxide, aluminum oxide, zirconium oxide, cerium oxide, titanium oxide, tantalum oxide and oxides of lanthanide elements.

The conductive structure 28 may correspond to a source line analogous to the source line 216 discussed above with reference to FIG. 4. The conductive structure 28 may comprise any suitable composition(s). In the shown embodiment, the conductive structure 28 comprises conductively-doped semiconductor material 30 (for instance, n-type silicon) over and directly against a metal-containing material 32. The metal-containing material may comprise, for example, one or more of titanium nitride, tungsten, tantalum nitride, etc.).

In some embodiments, the conductive structure 28 may be considered to be representative of a horizontally-extending structure.

The conductive structure 28 is shown to be supported over a base 34. The base 34 may comprise semiconductor material; and may, for example, comprise, consist essentially of, or consist of monocrystalline silicon. The base 34 may be referred to as a semiconductor substrate. The term "semiconductor substrate" means any construction comprising semiconductive material, including, but not limited to, bulk semiconductive materials such as a semiconductive wafer (either alone or in assemblies comprising other materials), and semiconductive material layers (either alone or in assemblies comprising other materials). The term "substrate" refers to any supporting structure, including, but not limited to, the semiconductor substrates described above. In some applications, the base 34 may correspond to a semiconductor substrate containing one or more materials associated with integrated circuit fabrication. Such materials may include, for example, one or more of refractory metal materials, barrier materials, diffusion materials, insulator materials, etc.

A space (i.e., gap) is provided between the conductive structure 28 and the base 34 to indicate that other components and materials may be provided between the conductive structure 28 and the base 34. Such other components and materials may insulative materials, conductive interconnects, CMOS circuitry, etc.

Figure 6:
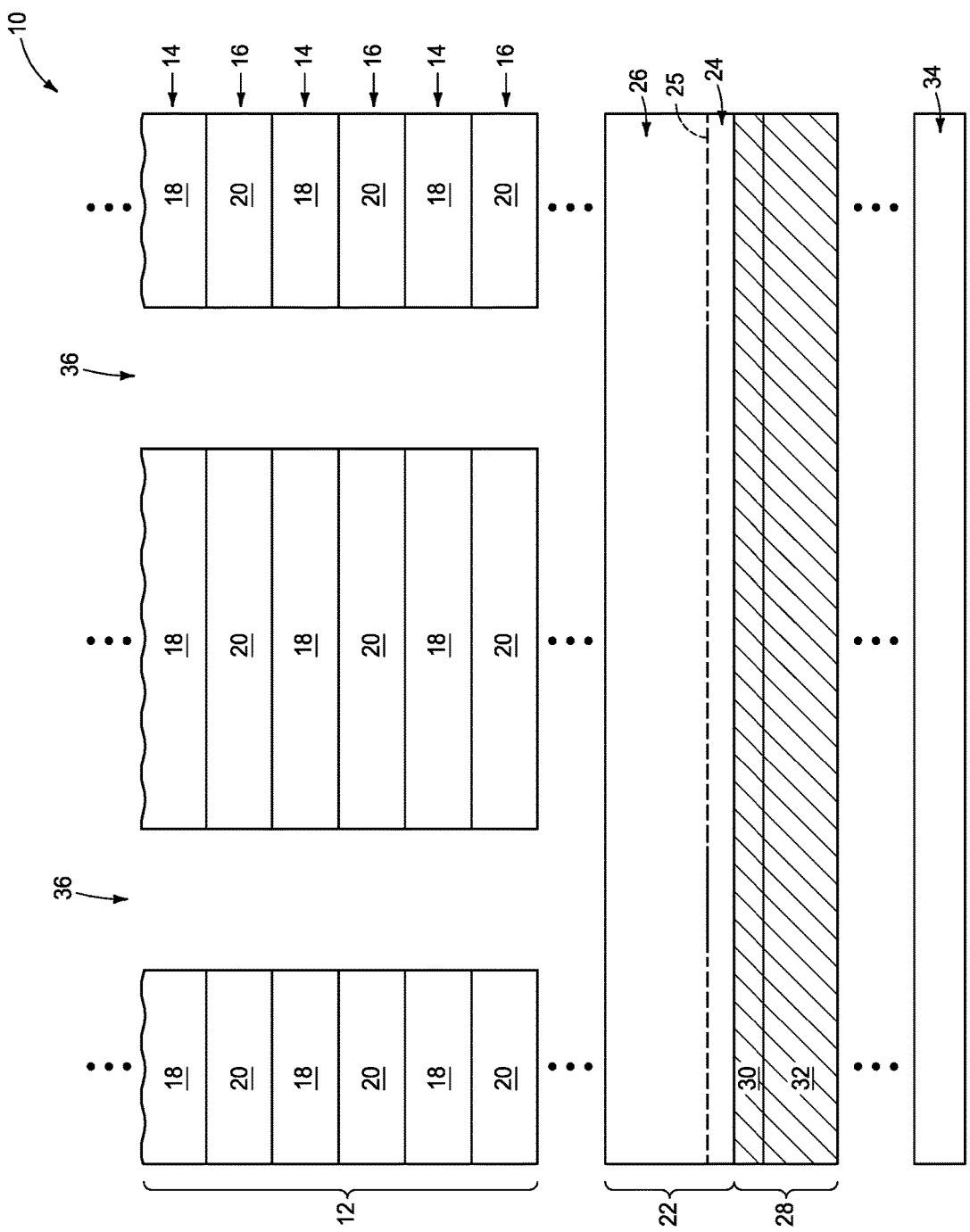

Referring to FIG. 6, openings 36 are formed through the stack 12. The openings are ultimately utilized for fabricating channel material pillars associated with vertically-stacked memory cells of a memory array, and in some embodiments may be referred to as pillar openings. The openings 36 may have any suitable configuration when viewed from above; and in some example embodiments may be circular, elliptical, polygonal, etc. The pillar openings 36 may be representative of a large number of substantially identical openings formed at the processing stage of FIG. 6 (with the term "substantially identical" meaning identical to within reasonable tolerances of fabrication and measurement).

In the shown embodiment, the openings extend to an upper surface of the etch-stop material corresponding to the insulative mass 22.

The openings 36 may be formed with any suitable processing. For instance, a patterned mask (not shown) may be formed over the stack 12 to define locations of the openings 36, and then the openings may be formed through the stack 12 utilizing one or more suitable anisotropic etches.

Figure 7:
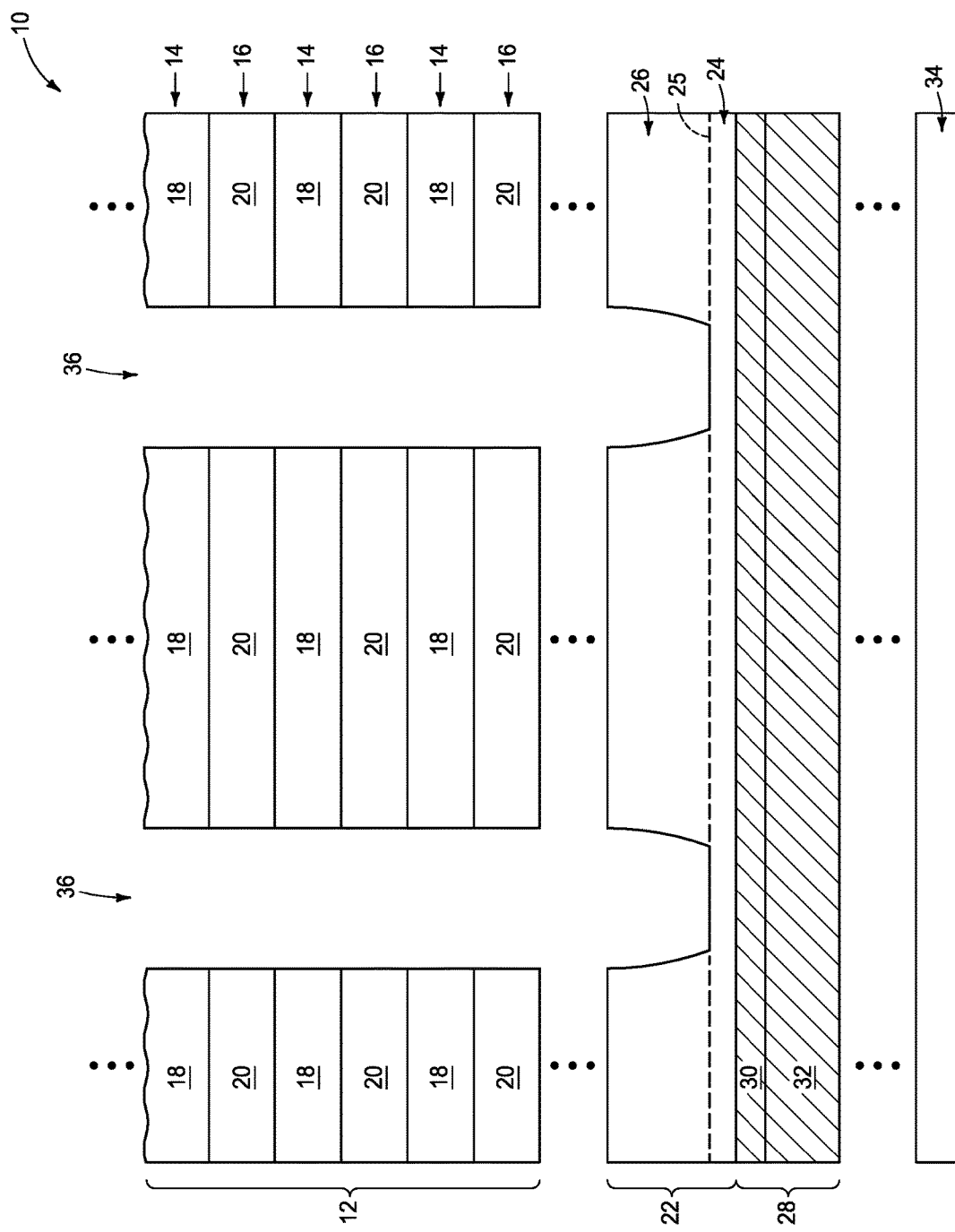

Referring to FIG. 7, anisotropic etching is utilized to penetrate through the upper region 26 of the insulative mass 22. The anisotropic etching ceases upon reaching the lower region 24. Such ceasing may be accomplished utilizing a timed etch and/or may result from the etch conditions being chosen to slow, or even stop, after passing through the higher density material of the second region 26 and reaching the lower density material of the first region 24. In some embodiments, the anisotropic etching may form the openings 36 to penetrate into the lower-density region 24 of the insulative mass 22 rather than ceasing immediately upon reaching the lower-density region 24.

The processing of FIGS. 6 and 7 describes the etching conditions as stopping upon reaching the upper surface of material 22, and then proceeding into material 22 with additional anisotropic etching. However, it is to be understood that in some embodiments suitable anisotropic etching conditions may be chosen such that the same anisotropic etching conditions may be utilized to penetrate through the stack 12 and through the upper region 26 of the insulative mass 22 without stopping at the upper surface of the insulative mass 22.

FIG. 7 shows the bottom regions of the openings 36 having tapered sidewall edges, rather than having straight sidewall edges. Such can be a common problem, particularly with the increasing critical dimensions in highly-integrated applications. It is desired to alleviate the tapered sidewall edges along the bottoms of the openings 36, and in some embodiments the rapid-wet-etch-rate associated with lower density region 24 may be utilized to improve the configuration of the sidewall edges along the bottoms of the openings 36.

Figure 8:
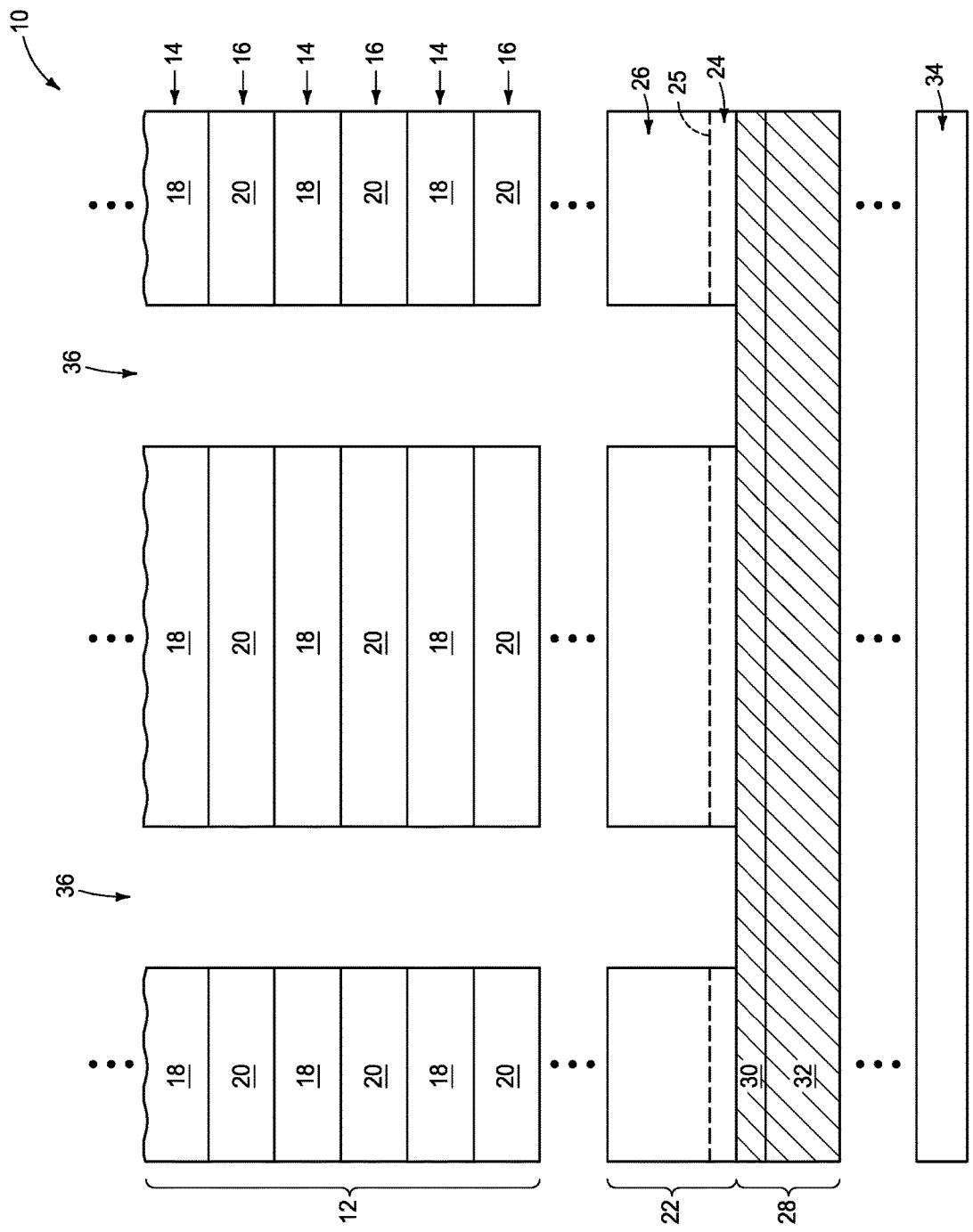

FIG. 8 shows construction 10 after the wet etching is utilized to extend openings 36 to the conductively-doped semiconductor material 30 (e.g., conductively-doped silicon) of the conductive structure 28. In the shown embodiment, the openings stop at an upper surface of the material 30, but in other embodiments the openings 36 may penetrate into material 30.

The wet etching utilized to extend through the lower-density region 24 of insulative material 22 reduces the taper along the lower portions of openings 36 (with such taper being shown in FIG. 7). In the shown embodiment, the wet etching has entirely removed the taper, and formed sidewalls which are substantially straight and vertical. In other embodiments, the wet etching may or may not form substantially straight sidewalls. For instance, the wet etching may reduce the taper without entirely remove the taper, or the wet etching may over-compensate for the taper and form sidewalls which bow outwardly from the openings 36. The sidewall shape along the bottoms of openings 36 may be tailored for specific applications by, for example, adjusting wet-etching conditions, adjusting the relative densities and compositions of the lower portion 24 and the upper portion 26 of the insulative mass 22, adjusting the relative thicknesses of the lower portion 24 and the upper portion 26 of the insulative mass 22, etc.

Figure 9:
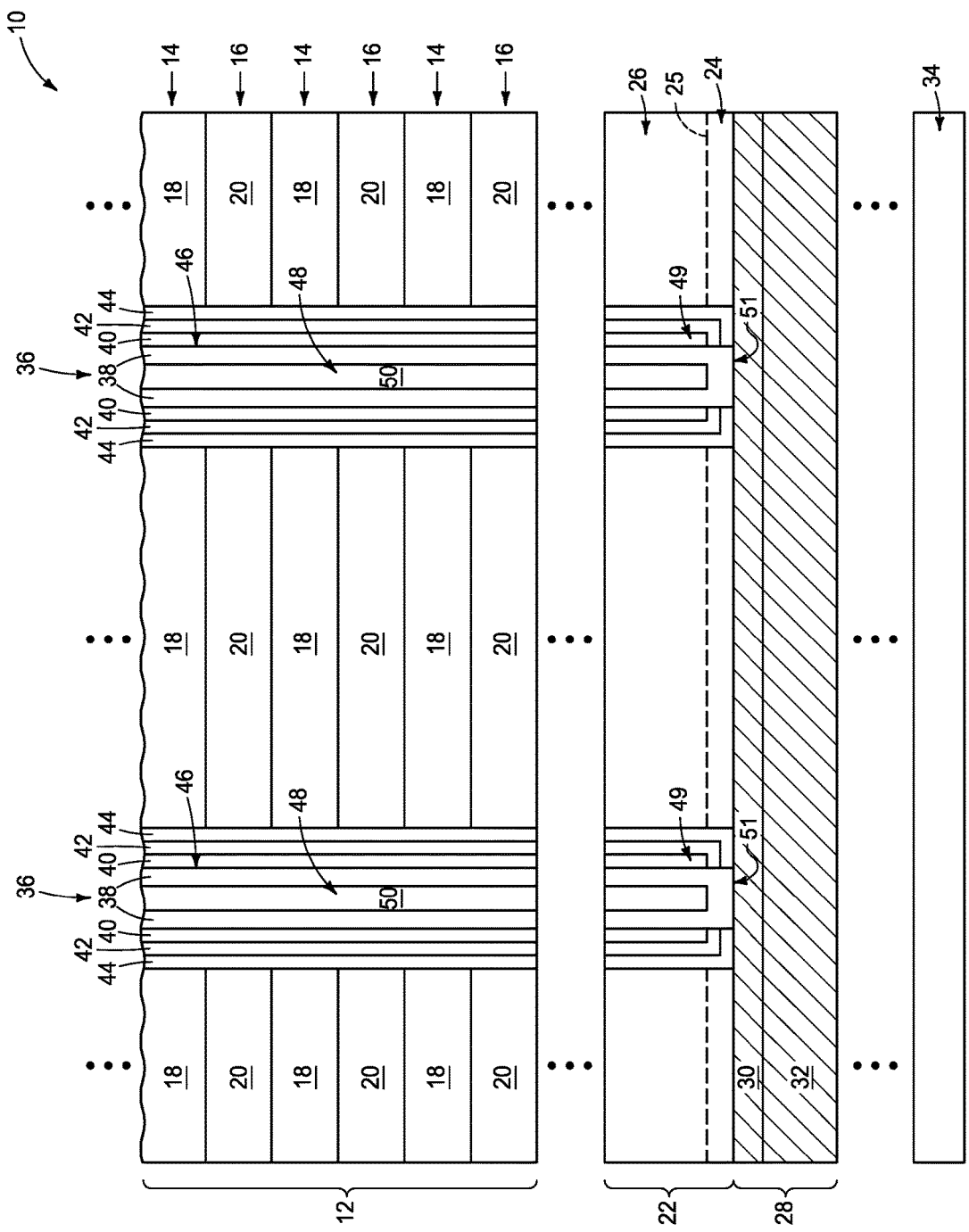

Referring to FIG. 9, channel material 38 is formed within the openings 36, together with tunneling material 40, charge-storage material 42, and charge-blocking material 44.

The tunneling material 40 is sometimes referred to as gate dielectric. The tunneling material 40 may comprise any suitable composition(s); and in some embodiments may comprise, for example, one or more of silicon dioxide, aluminum oxide, hafnium oxide, zirconium oxide, etc.

The charge-storage material 42 may comprise any suitable composition(s); and in some embodiments may comprise charge-trapping materials, such as silicon nitride, silicon oxynitride, conductive nanodots, etc. In alternative embodiments (not shown), the charge-storage material 42 may be configured as floating gate material (such as, for example, polycrystalline silicon).

The charge-blocking material 44 may comprise any suitable composition(s); and in some embodiments may comprise one or more of silicon dioxide, aluminum oxide, hafnium oxide, zirconium oxide, etc.

The channel material 38 is configured as vertically-extending channel material pillars 46. In the illustrated embodiment, the pillars 46 are "hollow" in that they have voids 48 extending therein. Such voids are filled with insulative material 50. In other embodiments, the pillars 46 may be solid rather than being in the illustrated hollow configuration. The insulative material 50 may comprise any suitable composition or combination of compositions; and in some embodiments may comprise, consist essentially of, or consist of silicon dioxide.

In some embodiments, the channel material 38 may be referred to as a second semiconductor material to distinguish it from the first semiconductor material 30. The second semiconductor material 38 may be compositionally the same as the first semiconductor material 30, or may be compositionally different from the first semiconductor material 30. For instance, in some embodiments the second semiconductor material 38 and the first semiconductor material 30 may both comprise silicon. In other embodiments, one of the first and second semiconductor materials 38 and 30 may comprise, consist essentially of, or consist of silicon; while the other comprises a different semiconductor material.

The semiconductor materials 30 and 38 may comprise any suitable semiconductor materials; and in some embodiments may comprise, consist essentially of, or consist of one or more of silicon, germanium, III/V semiconductor material (e.g., gallium phosphide), semiconductor oxide, etc.; with the term III/V semiconductor material referring to semiconductor materials comprising elements selected from groups III and V of the periodic table (with groups III and V being old nomenclature, and now being referred to as groups 13 and 15). The semiconductor materials 30 and 38 may be appropriately doped for their particular applications (e.g., the semiconductor material 30 may be conductively-doped with n-type dopant).

The channel material 38 of the vertically-extending channel material pillars 46 directly contacts the horizontally-extending semiconductor material 30. The terms "vertically-extending" and "horizontally-extending" are utilized relative to one another to indicate that the structure 28 extends primarily along a horizontal direction, while the structures 46 extend primarily along the vertical direction. In some embodiments, the structures 46 may extend substantially orthogonally relative to the structure 28, with the term "substantially orthogonal" meaning orthogonal to within reasonable tolerances of fabrication and measurement.

The channel material pillars 46 have bottom regions 49 within the insulative mass 22. Such bottom regions include terminal ends 51 of the pillars 46. The terminal ends 51 directly contact the semiconductor material 30 of the conductive structure 28.

Figure 10:
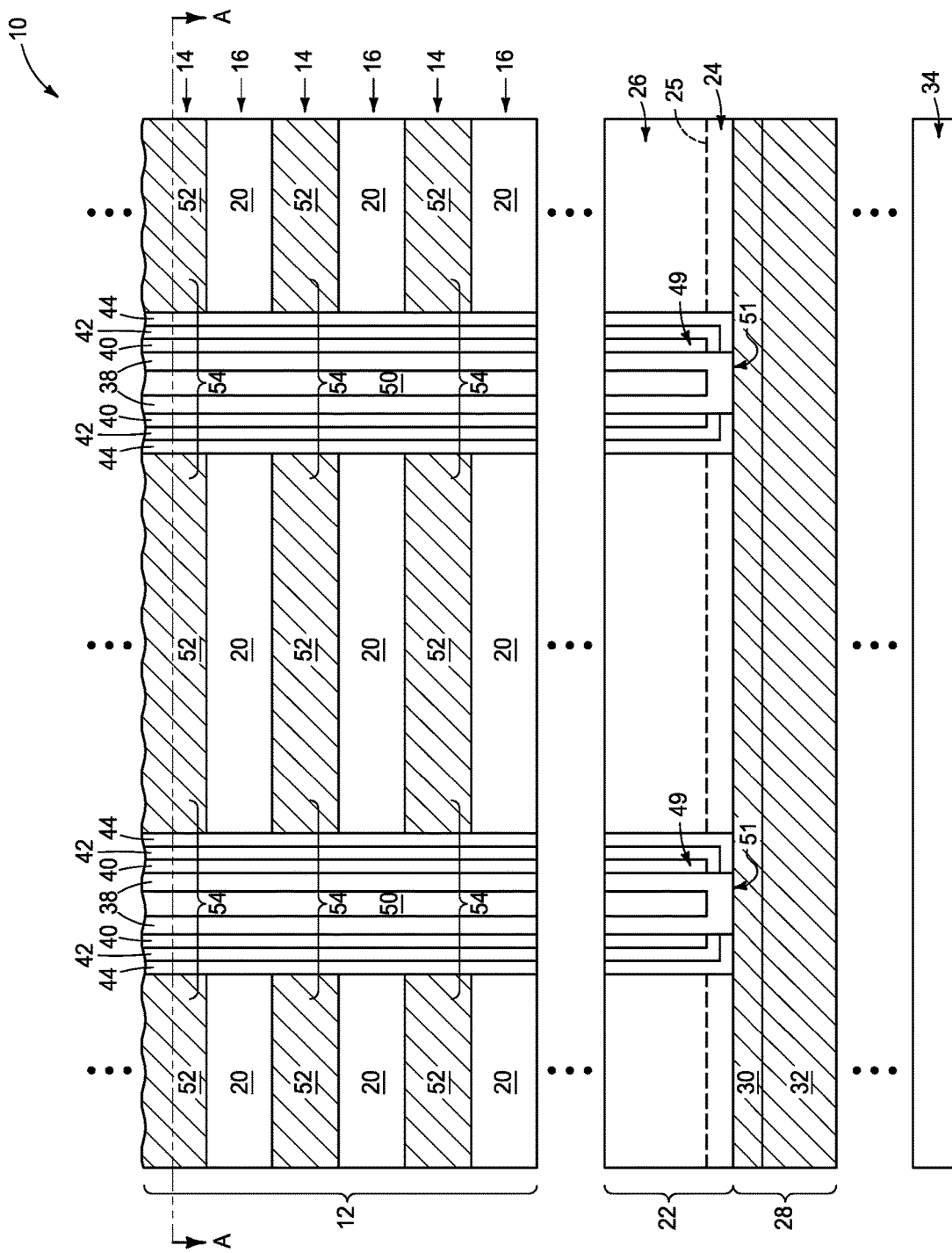

Referring to FIG. 10, the sacrificial material 18 of FIG. 9 is replaced with conductive material 52, and the levels 14 become conductive levels (or wordline levels). The conductive material 52 may comprise, for example, one or more of various metals (for example, tungsten, titanium, etc.), metal-containing compositions (for example, metal nitride, metal carbide, metal silicide, etc.), and conductively-doped semiconductor materials (for example, conductively-doped silicon, conductively-doped germanium, etc.). For instance, the conductive levels 14 may comprise n-type doped polycrystalline silicon (i.e., n-type doped polysilicon) of SONOS (semiconductor-oxide-nitride-oxide-semiconductor), or metal of MONOS (metal-oxide-nitride-oxide-semiconductor); with an example MONOS being TANOS (tantalum-alumina-nitride-oxide-semiconductor). In some embodiments, the conductive levels 14 may comprise titanium nitride around a metallic core, with the metallic core comprising tungsten or tantalum.

In some embodiments the material 18 (FIG. 9) may comprise conductive material analogous to the conductive material 52. In such embodiments, the gate replacement described relative to FIG. 10 may be omitted.

The channel material 38, tunneling material 40, charge-storage material 42, and charge-blocking material 44 are together incorporated into a plurality of vertically-stacked memory cells 54. Such memory cells may be NAND memory cells, and may be part of a NAND memory array. The conductive levels 14 (i.e., wordline levels) of FIG. 10 comprise control gates for the memory cells 54. In some embodiments, the vertically-stacked memory cells 54 are configured as NAND strings, with the number of memory cells 54 in the individual strings being determined by the number of conductive levels 14.

In operation, the charge-storage material 42 may be configured to store information in the memory cells 54. The value (with the term "value" representing one bit or multiple bits) of information stored in an individual memory cell may be based on the amount of charge (e.g., the number of electrons) stored in a region of the charge-storage material. The amount of charge within a region of the charge-storage material may be controlled (e.g., increased or decreased), at least in part, based on the value of voltage applied to an associated gate of a memory cell 54, and/or based on the value of voltage applied to an associated channel material 38 of the memory cell.

The tunneling material 40 forms tunneling regions of the memory cells 54. Such tunneling regions may be configured to allow desired tunneling (e.g., transportation) of charge (e.g., electrons) between the charge-storage material 42 and the channel material 38 of the memory cells. The tunneling regions may be configured (i.e., engineered) to achieve a selected criterion, such as, for example, but not limited to, an equivalent oxide thickness (EOT); and may comprise a single composition, or two or more different compositions. The EOT quantifies the electrical properties of the tunneling region (e.g., capacitance) in terms of a representative physical thickness. For example, EOT may be defined as the thickness of a theoretical silicon dioxide layer that would be required to have the same capacitance density as a given dielectric (e.g., tunneling material), ignoring leakage current and reliability considerations.

The charge-blocking material 44 may comprise any suitable composition(s). The charge-blocking material 44 may provide a mechanism to block charge from flowing from the charge-storage material 40 to the associated gates of the memory cells; and/or may be utilized to inhibit back-tunneling of electrons from the gates toward the charge-storage material 40.

Figure 10A:
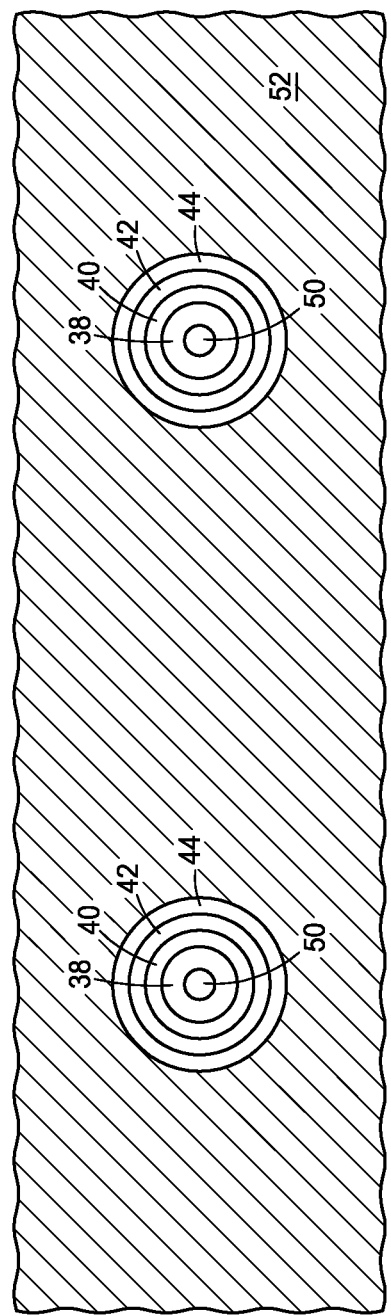
FIG. 10A is a top-down cross-sectional view along the line A-A of FIG. 10.

FIG. 10A is a view along the line A-A of FIG. 10, and shows example configurations for the various materials 38, 40, 42, 44 and 50.

Figure 11:
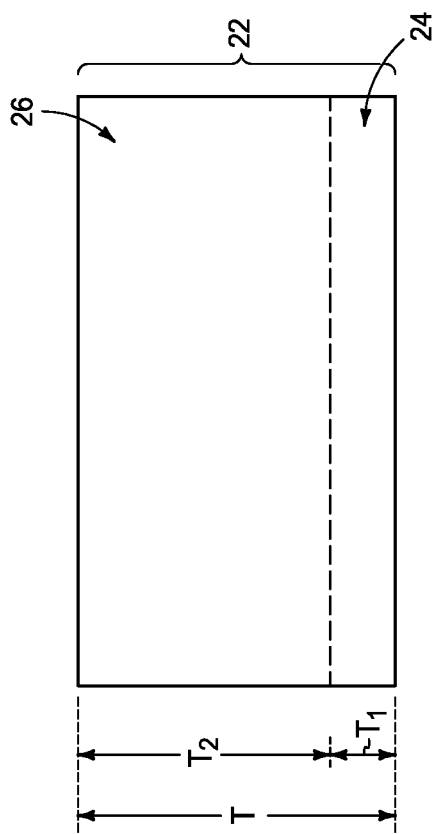
FIG. 11 is a diagrammatic cross-sectional side view of an example insulative mass.

The insulative mass 22 of FIGS. 5-10 may have any suitable configuration. FIG. 11 shows an example insulative mass. The insulative mass 22 has a total overall thickness T which may be within a range of from about 50 Å to about 2000 Å; and in some embodiments may be within a range of from about 50 Å to about 1000 Å. The lower region 24 has a thickness $T_1$ and the upper region 26 has a thickness $T_2$; with the overall thickness T being a sum of the thicknesses $T_1$ and $T_2$. In some embodiments, the thickness $T_1$ of the lower region 24 may be considered to comprise a percentage of the overall thickness T. In some embodiments, such percentage may be within a range of from about 5% to about 90% of the thickness T; and in some embodiments may be within a range of from about 15% to about 50% of the thickness T.

Figure 12:
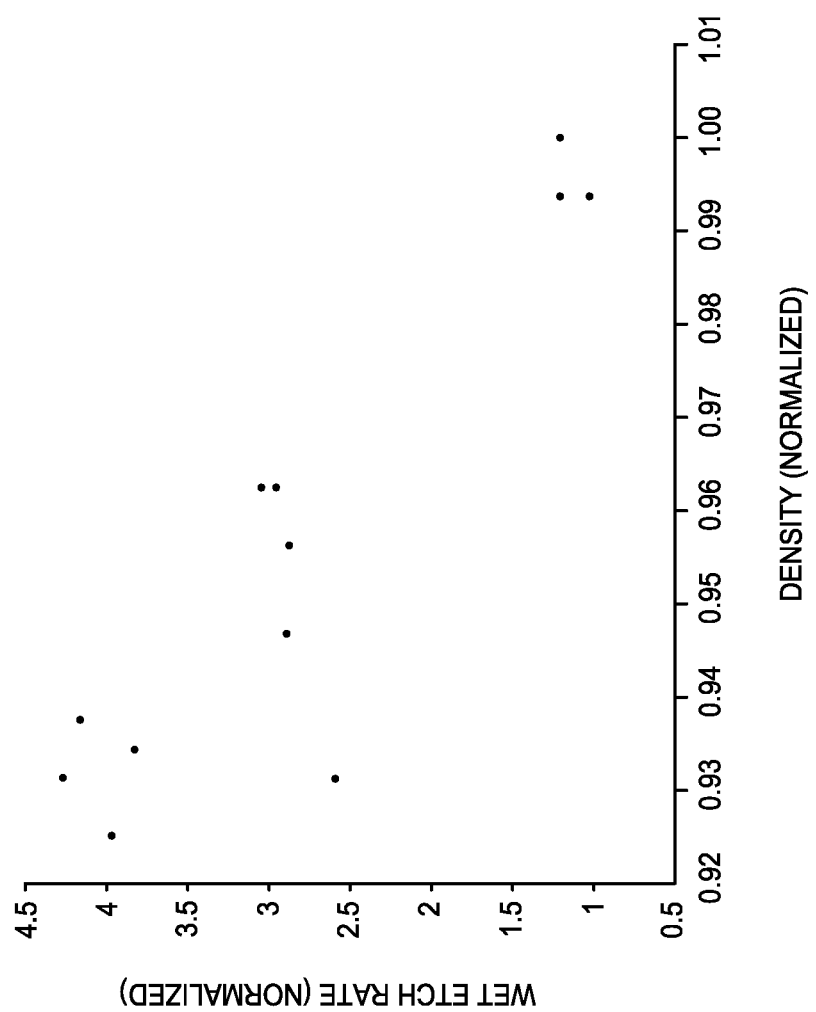
FIG. 12 shows a graph illustrating a relationship between wet etch rate and density for an example insulative mass.

As indicated above, a difference between the regions 24 and 26 of the insulative mass 22 may be the relative densities of such regions. For instance, the region 24 may have a lower density than the region 26 through incorporation of one or more inert interstitial elements into the region 24 to a higher amount (per unit volume) than in region 26. Such difference in relative densities may lead to a difference in wet etch rate between the regions 24 and 26. FIG. 12 graphically illustrates an example relationship between wet etch rate and density of an example insulative material. The relationship illustrated in FIG. 12 shows that the wet etch rate increases with decreasing density.

Figure 13:
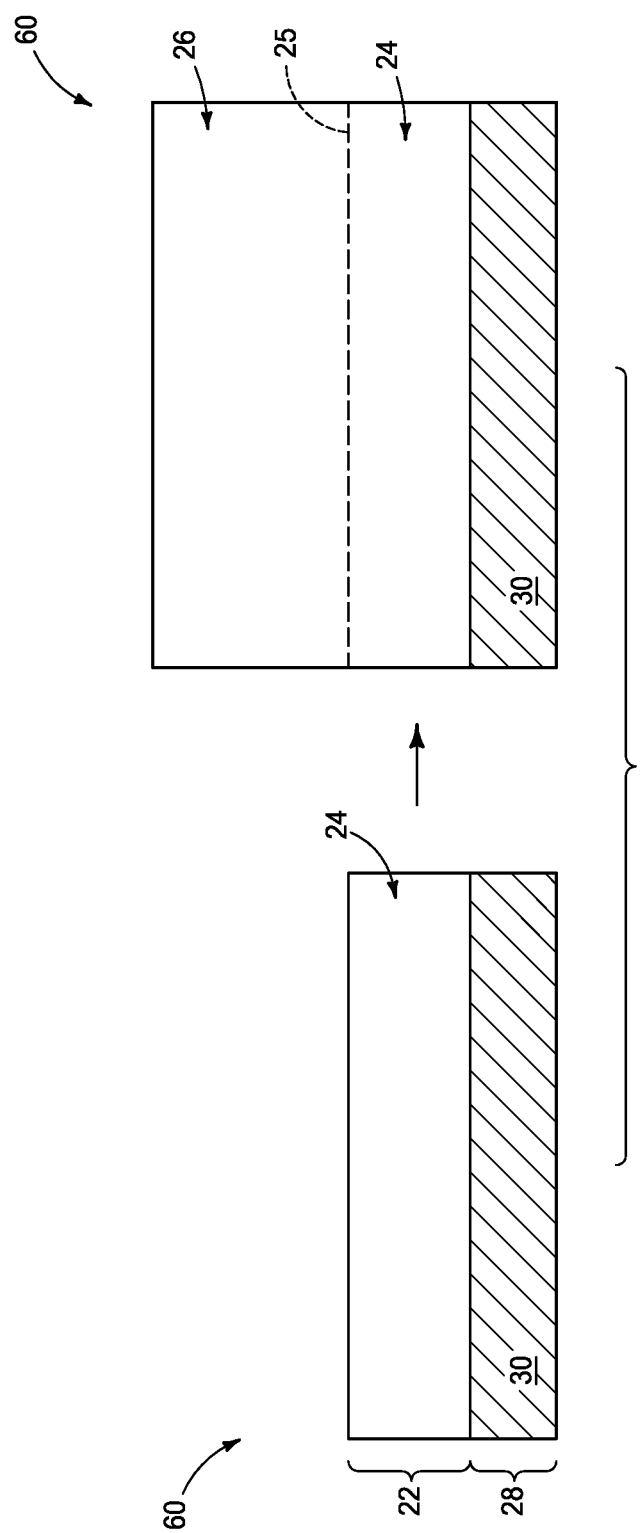
FIG. 13 shows diagrammatic cross-sectional side views of an example assembly comprising an insulative mass during example process stages.

The insulative mass 22 may be formed with any suitable processing. FIG. 13 diagrammatically illustrates example processing which may be utilized to form the insulative mass. The left side of FIG. 13 shows a construction 60 having the portion 24 of mass 22 formed over the conductive material 30 of the example structure 28 (i.e., the example source line structure).

The region 24 may be formed by depositing suitable insulative material over the conductive material 30. Such depositing may utilize chemical vapor deposition (CVD), atomic layer deposition (ALD), or any other suitable methodology. One or more inert interstitial elements may be incorporated into the insulative material to a desired concentration utilizing any suitable processing. For instance, the inert interstitial element(s) may be implanted into the region 24. Alternatively, the inert interstitial element(s) may be incorporated in situ into the region 24 during deposition of the region 24 by adjusting power, bias, etc., during the deposition of the material 24.

The right side of FIG. 13 shows construction 60 after the region 26 is formed over the region 24. The region 26 may be deposited utilizing any suitable methodology. The region 26 may be deposited under conditions which incorporate no inert interstitial element into such region; or may be deposited under conditions which incorporate one or more inert interstitial elements into the region, but to a lower amount (per unit volume) than is incorporated into the lower region 24. The upper region 26 may comprise a same insulative composition as the lower region 24, or may comprise a different insulative composition relative to the lower region 24.

The above-discussed insulative masses 22 have a lower-density region under a higher-density region. Such insulative masses may be particularly suitable for utilization in forming three-dimensional NAND in accordance with the methodologies of FIGS. 5-10. However, it is recognized that there may also be applications in which it is suitable to form analogous insulative masses, but in which the lower-density region is over the higher-density region. FIG. 14 shows an insulative mass 22 having the lower-density region 24 over the higher-density region 26, and shows such insulative mass supported by a semiconductor base 34.

The insulative mass 22 of FIG. 14 may be formed with processing analogous to that of FIG. 13; except that the upper region of the mass will have the higher concentration (per unit volume) of one or more inert interstitial elements as compared to the lower region of the mass.

The assemblies and structures discussed above may be utilized within integrated circuits (with the term "integrated circuit" meaning an electronic circuit supported by a semiconductor substrate); and may be incorporated into electronic systems. Such electronic systems may be used in, for example, memory modules, device drivers, power modules, communication modems, processor modules, and application-specific modules, and may include multilayer, multichip modules. The electronic systems may be any of a broad range of systems, such as, for example, cameras, wireless devices, displays, chip sets, set top boxes, games, lighting, vehicles, clocks, televisions, cell phones, personal computers, automobiles, industrial control systems, aircraft, etc.

Unless specified otherwise, the various materials, substances, compositions, etc. described herein may be formed with any suitable methodologies, either now known or yet to be developed, including, for example, atomic layer deposition (ALD), chemical vapor deposition (CVD), physical vapor deposition (PVD), etc.

The terms "dielectric" and "insulative" may be utilized to describe materials having insulative electrical properties. The terms are considered synonymous in this disclosure. The utilization of the term "dielectric" in some instances, and the term "insulative" (or "electrically insulative") in other instances, may be to provide language variation within this disclosure to simplify antecedent basis within the claims that follow, and is not utilized to indicate any significant chemical or electrical differences.

The particular orientation of the various embodiments in the drawings is for illustrative purposes only, and the embodiments may be rotated relative to the shown orientations in some applications. The descriptions provided herein, and the claims that follow, pertain to any structures that have the described relationships between various features, regardless of whether the structures are in the particular orientation of the drawings, or are rotated relative to such orientation.

The cross-sectional views of the accompanying illustrations only show features within the planes of the cross-sections, and do not show materials behind the planes of the cross-sections, unless indicated otherwise, in order to simplify the drawings.

When a structure is referred to above as being "on", "adjacent" or "against" another structure, it can be directly on the other structure or intervening structures may also be present. In contrast, when a structure is referred to as being "directly on", "directly adjacent" or "directly against" another structure, there are no intervening structures present.

Structures (e.g., layers, materials, etc.) may be referred to as "extending vertically" to indicate that the structures generally extend upwardly from an underlying base (e.g., substrate). The vertically-extending structures may extend substantially orthogonally relative to an upper surface of the base, or not.

Some embodiments include an integrated assembly having an insulative mass with a first region adjacent to a second region. The first region has a greater amount of one or more inert interstitial elements incorporated therein than does the second region.

Some embodiments include an integrated assembly having channel material pillars which extend vertically, and having memory cells along the channel material pillars. A conductive structure is under the channel material pillars. The conductive structure includes conductive material in direct contact with bottom regions of the channel material pillars. An insulative mass is along the bottom regions of the channel material pillars. The insulative mass has an upper region over a lower region. The lower region has a greater amount of one or more inert interstitial elements incorporated therein than does the upper region.

Some embodiments include an integrated assembly having a horizontally-extending structure which comprises a conductive material. One or more vertically-extending structures are over the horizontally-extending structure and comprise a semiconductor material. The semiconductor material of said one or more vertically-extending structures directly contacts the conductive material of the horizontally-extending structure along terminal ends of the one or more vertically-extending structures. Said terminal ends of the one or more vertically-extending structures are comprised by bottom regions of the one or more vertically-extending structures. An insulative mass is along the bottom regions of the one or more vertically-extending structures. The insulative mass has an upper region over a lower region. The lower region has a greater amount of one or more inert interstitial elements incorporated therein than does the upper region.

Some embodiments include a method of forming an integrated assembly. A horizontally-extending conductive structure is formed; and such conductive structure may comprise first semiconductor material. An insulative mass is formed across an upper surface of the conductive structure and directly against the upper surface of the conductive structure. The insulative mass has an upper region over a lower region, with the upper and lower regions both comprising a same insulative composition. The lower region has a higher wet etch rate than the upper region. A stack of alternating first and second levels is formed over the mass. Openings are formed to extend through the stack and into the insulative mass. The openings extend through the first region of insulative mass and expose the second region of the insulative mass. The openings are formed with an anisotropic etch. The openings are extended through the second region of the insulative mass with a wet etch. After extending the openings are extended through the second region of the insulative mass, vertically-extending channel material pillars are formed within the openings. The vertically-extending channel material pillars comprise second semiconductor material.

In compliance with the statute, the subject matter disclosed herein has been described in language more or less specific as to structural and methodical features. It is to be understood, however, that the claims are not limited to the specific features shown and described, since the means herein disclosed comprise example embodiments. The claims are thus to be afforded full scope as literally worded, and to be appropriately interpreted in accordance with the doctrine of equivalents.

We claim:

1. An integrated assembly comprising an insulative mass; the insulative mass having a first region adjacent a second region; the first region having a greater amount of one or more inert interstitial elements incorporated therein than the second region; and wherein the second region has about 0 atomic percent of the one or more inert interstitial elements incorporated therein.

2. An integrated assembly comprising an insulative mass; the insulative mass having a first region adjacent a second region; the first region having a greater amount of one or more inert interstitial elements incorporated therein than the second region; and wherein the second region has greater than 0 atomic percent of the one or more inert interstitial elements incorporated therein.

3. An integrated assembly comprising an insulative mass; the insulative mass having a first region adjacent a second region; the first region having a greater amount of one or more inert interstitial elements incorporated therein than the second region; and wherein an amount of the one or more inert interstitial elements incorporated within the second region is within a range of from about 0 atomic percent to less than or equal to about 2 atomic percent.

4. An integrated assembly comprising an insulative mass; the insulative mass having a first region adjacent a second region; the first region having a greater amount of one or more inert interstitial elements incorporated therein than the second region; and wherein an amount of the one or more inert interstitial elements incorporated within the second region is within a range of from about 0 atomic percent to less than or equal to about 0.5 atomic percent.

5. An integrated assembly comprising an insulative mass; the insulative mass having a first region adjacent a second region; the first region having a greater amount of one or more inert interstitial elements incorporated therein than the second region; and wherein the first region has at least about 1 atomic percent of the one or more inert interstitial elements incorporated therein.

6. An integrated assembly comprising an insulative mass; the insulative mass having a first region adjacent a second region; the first region having a greater amount of one or more inert interstitial elements incorporated therein than the second region; and wherein an amount of the one or more inert interstitial elements incorporated within the first region is within a range of from about 1 atomic percent to less than or equal to about 10 atomic percent.

7. An integrated assembly comprising an insulative mass; the insulative mass having a first region adjacent a second region; the first region having a greater amount of one or more inert interstitial elements incorporated therein than the second region; and wherein an amount of the one or more inert interstitial elements incorporated within the first region is within a range of from about 1 atomic percent to less than or equal to about 5 atomic percent.

8. An integrated assembly comprising an insulative mass; the insulative mass having a first region adjacent a second region; the first region having a greater amount of one or more inert interstitial elements incorporated therein than the second region; and wherein an amount of the one or more inert interstitial elements incorporated within the first region is within a range of from about 1 atomic percent to less than or equal to about 3 atomic percent.

9. An integrated assembly comprising an insulative mass; the insulative mass having a first region adjacent a second region; the first region having a greater amount of one or more inert interstitial elements incorporated therein than the second region; and wherein the one or more inert interstitial elements are selected from the group consisting of argon, xenon, krypton, helium, neon, and mixtures thereof.

10. An integrated assembly, comprising:
channel material pillars which extend vertically;
memory cells along the channel material pillars;
a conductive structure under the channel material pillars and comprising a conductive region in direct contact with bottom regions of the channel material pillars; and
an insulative mass along the bottom regions of the channel material pillars; the insulative mass having an upper region over a lower region; the lower region of the insulative mass having a greater amount of one or more inert interstitial elements incorporated therein than the upper region of the insulative mass.

11. The integrated assembly of claim 10 wherein the conductive region comprises doped semiconductor material.

12. The integrated assembly of claim 10 wherein the upper and lower regions both comprise a same insulative composition.

13. The integrated assembly of claim 10 wherein the upper and lower regions comprise different insulative compositions relative to one another.

14. The integrated assembly of claim 10 wherein the one or more inert interstitial elements are selected from the group consisting of argon, xenon, krypton, helium, neon, and mixtures thereof.

15. The integrated assembly of claim 10 wherein an amount of the one or more inert interstitial elements incorporated within the upper region is within a range of from about 0 atomic percent to less than or equal to about 2 atomic percent; and wherein an amount of the one or more inert interstitial elements incorporated within the lower region is within a range of from about 1 atomic percent to less than or equal to about 10 atomic percent.

16. The integrated assembly of claim 10 wherein the insulative mass includes one or more insulative oxides, with said one or more insulative oxides including at least one of magnesium oxide, scandium oxide, yttrium oxide, hafnium oxide, aluminum oxide, zirconium oxide, cerium oxide, titanium oxide, tantalum oxide and an oxide of a lanthanide element.

17. An integrated assembly comprising:
a horizontally-extending structure comprising a conductive material;
one or more vertically-extending structures over the horizontally-extending structure and comprising semiconductor material; the semiconductor material of said one or more vertically-extending structures directly contacting the conductive material of the horizontally-extending structure along terminal ends of the one or more vertically-extending structures; said terminal ends of the one or more vertically-extending structures being comprised by bottom regions of the one or more vertically-extending structures; and
an insulative mass along the bottom regions of the one or more vertically-extending structures; the insulative mass having an upper region over a lower region; the lower region of the insulative mass having a greater amount of one or more inert interstitial elements incorporated therein than the upper region of the insulative mass.

18. The integrated assembly of claim 17 wherein the semiconductor material is a second semiconductor material, and wherein the conductive material comprises a first semiconductor material.

19. The integrated assembly of claim 17 wherein the upper and lower regions both comprise a same insulative composition.

20. The integrated assembly of claim 17 wherein the upper and lower regions comprise different insulative compositions relative to one another.

21. The integrated assembly of claim 17 wherein the one or more inert interstitial elements are selected from the group consisting of argon, xenon, krypton, helium, neon, and mixtures thereof.

22. The integrated assembly of claim 17 wherein an amount of the one or more inert interstitial elements incorporated within the upper region is within a range of from about 0 atomic percent to less than or equal to about 2 atomic percent; and wherein an amount of the one or more inert interstitial elements incorporated within the lower region is within a range of from about 1 atomic percent to less than or equal to about 10 atomic percent.

23. The integrated assembly of claim 17 wherein the insulative mass includes one or more insulative oxides, with said one or more insulative oxides including at least one of magnesium oxide, scandium oxide, yttrium oxide, hafnium oxide, aluminum oxide, zirconium oxide, cerium oxide, titanium oxide, tantalum oxide and an oxide of a lanthanide element.

24. A method of forming an integrated assembly, comprising:
   forming a horizontally-extending conductive structure;
   forming an insulative mass directly against an upper surface of the conductive structure; the insulative mass having an upper region over a lower region, with the upper and lower regions both comprising a same insulative composition; the lower region having a higher wet etch rate than the upper region;
   forming a stack of alternating first and second levels over the mass;
   forming openings which extend through the stack and into the insulative mass; the openings extending through the first region of insulative mass and exposing the second region of the insulative mass; the openings being formed with an anisotropic etch;
   extending the openings through the second region of the insulative mass with a wet etch; and
   after extending the openings through the second region of the insulative mass, forming vertically-extending channel material pillars within the openings; the vertically-extending channel material pillars comprising semiconductor material.

25. The method of claim 24 wherein the semiconductor material is a second semiconductor material, and wherein the conductive structure comprises a first semiconductor material; and wherein the insulative mass is formed directly against an upper surface of the first semiconductor material.

26. The method of claim 24 wherein the lower region of the insulative mass has a lower density than the upper region of the insulative mass.

27. The method of claim 24 wherein the insulative mass has a total thickness which is a sum of a thickness of the lower region and a thickness of the upper region; and wherein the thickness of the lower region is within a range of from about 5% to about 90% of the total thickness of the insulative region.

28. The method of claim 24 wherein the insulative mass has a total thickness which is a sum of a thickness of the lower region and a thickness of the upper region; and wherein the thickness of the lower region is within a range of from about 15% to about 50% of the total thickness of the insulative region.

29. The method of claim 24 wherein the lower region of the insulative mass has a greater amount of one or more inert interstitial elements incorporated therein than the upper region of the insulative mass.

30. The method of claim 29 wherein the one or more inert interstitial elements are selected from the group consisting of argon, xenon, krypton, helium, neon, and mixtures thereof.

31. The method of claim 30 wherein an amount of the one or more inert interstitial elements incorporated within the upper region is within a range of from about 0 atomic percent to less than or equal to about 2 atomic percent; and wherein an amount of the one or more inert interstitial elements incorporated within the lower region is within a range of from about 1 atomic percent to less than or equal to about 10 atomic percent.

32. The method of claim 24 wherein the insulative mass includes one or more insulative oxides, with said one or more insulative oxides include at least one of magnesium oxide, scandium oxide, yttrium oxide, hafnium oxide, aluminum oxide, zirconium oxide, cerium oxide, titanium oxide, tantalum oxide and an oxide of a lanthanide element.

* * * * *